United States Patent
Rafi

(10) Patent No.: US 8,571,512 B2
(45) Date of Patent: *Oct. 29, 2013

(54) IMPLEMENTING A PASSIVE ROTATING HARMONIC REJECTION MIXER (RHRM) FOR A TV TUNER IN AN INTEGRATED CIRCUIT

(75) Inventor: Aslamali A. Rafi, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/343,828

(22) Filed: Jan. 5, 2012

(65) Prior Publication Data

US 2013/0178183 A1    Jul. 11, 2013

(51) Int. Cl.
*H04B 1/26* (2006.01)
(52) U.S. Cl.
USPC ............ 455/326; 455/130; 455/323; 455/333
(58) Field of Classification Search
USPC .......................................................... 455/326
See application file for complete search history.

(56) References Cited

U.S. PATENT DOCUMENTS

| | | | |
|---|---|---|---|
| 6,049,573 A | 4/2000 | Song | |
| 6,584,304 B1 * | 6/2003 | Thomsen et al. | 455/188.1 |
| 6,909,882 B2 | 6/2005 | Hayashi et al. | |
| 6,909,883 B2 | 6/2005 | Fujiwara | |
| 6,970,688 B2 | 11/2005 | Nibe | |
| 6,996,379 B2 | 2/2006 | Khorram | |
| 7,158,768 B2 * | 1/2007 | Woo et al. | 455/179.1 |
| 7,187,913 B1 | 3/2007 | Rahn et al. | |
| 7,359,678 B2 | 4/2008 | Hayashi et al. | |
| 7,392,026 B2 | 6/2008 | Alam et al. | |
| 7,395,087 B2 | 7/2008 | Watanabe | |
| 7,457,606 B2 | 11/2008 | Kim | |
| 7,460,844 B2 * | 12/2008 | Molnar et al. | 455/130 |
| 7,509,110 B2 | 3/2009 | Hayashi et al. | |
| 7,756,504 B2 | 7/2010 | Rafi | |

(Continued)

FOREIGN PATENT DOCUMENTS

EP    1 376 851    2/2004

OTHER PUBLICATIONS

Jeffrey A. Weldon, et al., "A 1.75GHz Highly-Integrated Narrow-Band CMOS Transmitter With Harmonic-Rejection Mixers," Dec. 2001, pp. 2003-2015.

(Continued)

*Primary Examiner* — Ajibola Akinyemi
(74) *Attorney, Agent, or Firm* — Trop, Pruner & Hu, P.C.

(57) ABSTRACT

In one embodiment, a passive rotating harmonic rejection mixer (RHRM) is provided that can directly couple to an antenna to receive an incoming radio frequency (RF) signal. This RHRM can have a master RF device to receive the signal and provide first and second RF currents, a master LO device coupled to an output of the master RF device to receive the RF currents and mix them with a master clock signal of multiple polarities to obtain a mixed signal pair. The RHRM may further include a rotating switch coupled to the master LO device to cyclically switch the mixed signal pair to one of multiple virtual ground nodes at an output of the rotating switch, and operational amplifiers each having a first input terminal coupled to one of the virtual ground nodes and having a feedback filter coupled thereto.

21 Claims, 6 Drawing Sheets

(56) References Cited

U.S. PATENT DOCUMENTS

| | | |
|---|---|---|
| 7,860,480 B2 | 12/2010 | Rafi |
| 7,986,926 B2 | 7/2011 | Rafi et al. |
| 2003/0138062 A1 | 7/2003 | Smith |
| 2006/0128334 A1 | 6/2006 | Ikuta et al. |
| 2006/0128338 A1 | 6/2006 | Kerth et al. |
| 2006/0159202 A1 | 7/2006 | Breiling |
| 2006/0286939 A1 | 12/2006 | Yamawaki et al. |
| 2007/0129034 A1 | 6/2007 | Adams et al. |
| 2007/0135074 A1 | 6/2007 | Igarashi et al. |
| 2007/0207760 A1 | 9/2007 | Kavadias et al. |
| 2008/0081568 A1 | 4/2008 | Kanaya |
| 2010/0233987 A1 | 9/2010 | Rafi |
| 2010/0240335 A1 | 9/2010 | Rafi |
| 2011/0065411 A1 | 3/2011 | Rafi |
| 2011/0201289 A1 | 8/2011 | Rafi |

OTHER PUBLICATIONS

Raja S. Pullela, et al., "Low Flicker-Noise Quadrature Mixer Topology," 2006, pp. 1-10.

U.S. Appl. No. 13/285,126, filed Oct. 31, 2011, entitled "A Rotating Harmonic Rejection Mixer," by Aslamali A. Rafi.

Klumperink, E.A.M., "A CMOS Switched Transconductor Mixer in: Solid-State Circuits," IEEE Journal, vol. 39 No. 8, Aug. 2004, pp. 1231-1240.

\* cited by examiner

IMPLEMENTING A PASSIVE ROTATING HARMONIC REJECTION MIXER (RHRM) FOR A TV TUNER IN AN INTEGRATED CIRCUIT

BACKGROUND

For terrestrial television (TV), signals can exist in any of multiple bands, namely very high frequency (VHF)-low, VHF-high, and ultra high frequency (UHF), collectively ranging from 54 MHz to 806 MHz, while for cable TV, signals can exist anywhere from 54 MHz to 1002 MHz. Thus a given television tuner must be designed to handle this extremely large frequency range. The tuner receives incoming signals at these high frequencies and downconverts them to a lower frequency, generally referred to as an intermediate frequency (IF) for certain signal processing. These downconverted signals are still further downconverted to baseband for further processing and demodulation to obtain audio and visual signals for output to an associated display.

To effect the downconversion, a mixer is provided that receives the incoming radio frequency (RF) signal and mixes it with a local oscillator (LO) frequency to obtain a lower frequency signal. To avoid interference with harmonics of this LO signal, a harmonic rejection mixer may be used. In U.S. Pat. No. 7,756,504, the disclosure of which is hereby incorporated by reference, a rotating harmonic rejection mixer was disclosed, where to further reduce harmonics, the output signal of a mixer is switched among multiple IF stages, the outputs of which are summed together to generate an IF signal for further processing. The number of stages to which the IF signal is rotated can vary based upon the input signal. The rotating harmonic rejection mixer has a property of rejecting all harmonics until N-1, where N is the number of rotation stages used. While the disclosed rotating harmonic rejection mixer represents an improvement over existing harmonic rejection mixers, challenges still exist in implementing the mixer into a feasible semiconductor device.

Many receivers implement other mixer types such as a Gilbert cell type quadrature mixer. However, such mixers are noisy for given current and linearity requirements. Accordingly, receivers generally include various front end RF circuitry in front of a mixer to reduce noise. Particularly, receivers generally incorporate a low noise amplifier (LNA) to both amplify an incoming RF signal and to reduce its noise factor prior to input to the mixer. Oftentimes, this low noise amplifier can be of a differential form, as the incoming RF signal to the LNA may be differentially provided, e.g., as output from a balun, which is a circuit to receive a single-ended RF signal and convert it to differential form. Typically, the balun can be used to provide a balanced input to the LNA, aiding in a higher second order linearity (IIP2) of the receiver. Oftentimes further included in this front end circuitry can be some type of filter such as a pre-filter, tracking filter or so forth. Generally the RF filter can be used to attenuate blockers and improve overall system selectivity and further aid in harmonic rejection performance by attenuating blockers around the LO frequency.

However, by imposition of these front end components, overall system linearity can be degraded as the mixer receives amplified signals. And, the inclusion of these front end circuits increase circuit complexity, cost, power consumption and chip real estate.

SUMMARY OF INVENTION

According to one aspect, the present invention is directed to a passive rotating harmonic rejection mixer that can be implemented in a variety of devices for use in receiving and processing incoming radio frequency (RF) signals such as broadcast signals. The mixer can include a master RF device to receive the incoming RF signal and provide an RF current. In various implementations, the master RF device can be a first transconductor to receive the incoming RF signal and another transconductor to receive the incoming RF signal.

The mixer can further include a master local oscillator (LO) device coupled to an output of the master RF device to receive the RF current and mix it with a master clock signal to obtain a mixed signal pair. In one implementation, the master LO device may include differential pairs each coupled to one of the transconductors. In turn, a rotating switch stage may be coupled to the master LO device to cyclically switch the mixed signal pair to one of multiple output ports of the rotating switch stage, where the rotating switch stage includes switching pairs each to receive one of the mixed signal pair.

Still further, the mixer can have mixer loads each coupled to one of the output ports, each to perform gaining and filtering of the mixed signal pair and having an operational amplifier with a first input terminal coupled to a corresponding output port and a second input terminal to couple to a reference potential. In turn, a resistor can be coupled to each of the mixer loads to weight the output of the corresponding mixer load and to provide an output to a summer.

In various embodiments, a capacitance may be coupled to the first input terminal of each of the operational amplifiers at a virtual ground node, with a filter coupled in a feedback loop between an output and the first input terminal of each of the operational amplifiers. This filter may be formed as a capacitor coupled in parallel with a resistor, where no DC current flows through the filter.

Another aspect of the present invention is directed to an apparatus with a master RF device to receive an incoming single-ended RF signal and provide first and second RF currents, a master LO device coupled to an output of the master RF device to receive the RF currents and mix them with a master clock signal of a first polarity and a second polarity to obtain a mixed signal pair. The apparatus may further include a rotating switch coupled to the master LO device to cyclically switch the mixed signal pair to one of multiple virtual ground nodes at an output of the rotating switch, and operational amplifiers each having a first input terminal coupled to one of the virtual ground nodes and having a feedback filter coupled thereto. Still further, the apparatus can include gain stages each coupled to one of the operational amplifiers to weight the output of the corresponding operational amplifier, and a summer coupled to the gain stages to sum an output of each of the gain stages. The resulting apparatus may be a passive rotating harmonic rejection mixer (RHRM), which can be configured to receive the incoming single-ended RF signal directly from an antenna.

A still further aspect of the present invention is directed to a system with an antenna to receive a RF signal, a passive RHRM coupled directly to the antenna to receive and downconvert the RF signal to a second frequency signal, second frequency circuitry coupled to the RHRM to receive and process the second frequency signal, and a demodulator coupled to this circuitry to demodulate the processed second frequency signal to obtain a demodulated signal. This direct coupling of the RHRM may be without a low noise amplifier, a balun or a tracking filter. In one such implementation, a pair of capacitances can be coupled to the antenna to AC couple the RF signal to the passive RHRM. Further, a first inductor may be coupled between a reference voltage node and a first input terminal of a transconductor stage of the RHRM and a second inductor can be coupled between a supply voltage node and a second input terminal of the transconductor stage.

DETAILED DESCRIPTION

In various embodiments, a passive rotating harmonic rejection mixer may be provided to achieve a higher linearity for a given power supply voltage for a mixing operation between an incoming radio frequency (RF) signal and a clock frequency signal, such as a master clock which may be a square wave signal having a frequency that is a multiplied version of a local oscillator (LO) frequency. In addition, by way of the passive design, power consumption can be reduced by preventing DC currents from passing through a load of the mixer. In various embodiments, the passive rotating harmonic rejection mixer may be controlled to enable some or all of a plurality of gain stages of an intermediate frequency (IF), which are then summed to provide an output IF signal for further processing in a given receiver. As used herein, the term "rotating" means that an output of a mixing operation is cyclically rotated to different IF gain stages during a given time period.

Due to the design of the mixer in which the incoming RF signal is downmixed, e.g., to an IF frequency, after which this IF signal is processed by way of gaining, filtering and so forth, any mismatch-causing devices do not operate at high frequencies. Accordingly, better matching passive components may be used and feedback around active devices is also implemented to improve harmonic rejection at significantly lower power and area consumption.

Furthermore, these front-end devices, i.e., in the RF portion and a local oscillator path, can be formed of minimal-sized devices leading to improved power and area reductions. Further as will described herein, as the passive rotating harmonic rejection mixer can be highly linear and have a low noise factor, in certain implementations it is possible to avoid use of a front end pre-filter, balun, and/or low noise amplifier (LNA).

While the scope of the present invention is not limited in this regard, such a mixer may be incorporated into various receivers such as a television receiver, radio receiver or other receiver of incoming RF signals. Because the number of such gain stages can be dynamically controlled, embodiments may provide for control of an amount of harmonic rejection to be provided, which may vary given a frequency at which the incoming signals are received. For example, in the context of a television receiver, incoming signals may be received via broadcast of over-the-air signals at VHF or UHF frequencies or via broadband cable at a higher frequency. Depending upon the frequency at which the tuner operates, differing amounts of gain stages may be provided to enable a controllable amount of harmonic rejection to be realized, while also preventing flicker noise from affecting the noise factor in the mixer.

Figure 1:
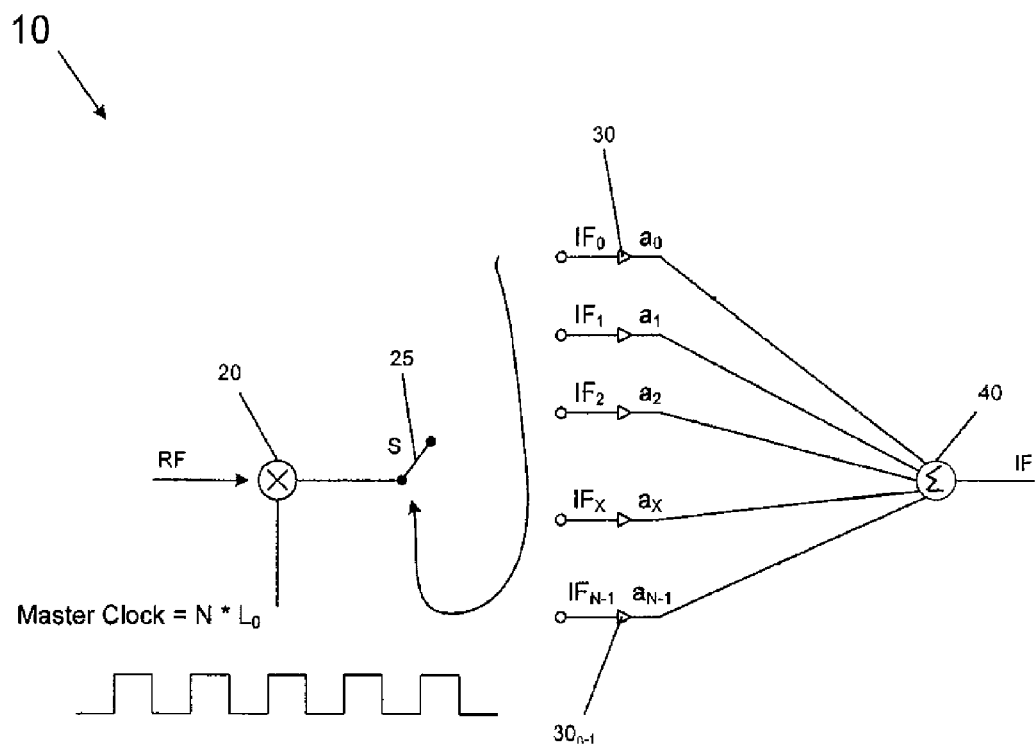
FIG. 1 is a high level block diagram of a mixer in accordance with an embodiment of the present invention.

Referring now to FIG. 1, shown is a block diagram of a mixer system in accordance with an embodiment of the present invention. As shown in FIG. 1, mixer system 10 is coupled to receive an incoming RF signal at a mixer 20, which mixes the incoming signal with a master clock signal. The master clock may be at a frequency of N×LO, where N is an integer corresponding to a number of gain stages (discussed below) in mixer system 10 and LO is at an output frequency of an LO (not shown in FIG. 1). In various embodiments, the LO may include a voltage controlled oscillator (VCO) that generates a sine wave, that in turn may be modified into a square wave signal (e.g., via a frequency divider) along an LO path such that the master clock provided to mixer 20 is a square wave signal. Mixer 20 may thus multiply the incoming RF signal by the master clock and the result is then rotated between a plurality of individual gain stages $30_0$-$30_{N-1}$ (generically gain stage 30). As will be described further below, each gain stage 30 has a different gain factor $a_0$-$a_{N-1}$ associated therewith.

A switch 25 may be controlled to cyclically rotate the output from mixer 20 to each of gain stages 30. The angular velocity of rotation sets the effective LO frequency. For example, if switch 25 has completed one rotation in N cycles of the master clock, the effective LO equals the master clock frequency divided by N. In various implementations, switch 25 may be controlled to be connected to a given gain stage 30 when the LO is at a high value (i.e., when there is a signal through switch 25). When there is no signal through switch 25 (i.e., when the LO is at a low state), it may be rotated to the next gain stage 30. In this way, switch 25 does not contribute any noise, and any offsets within operation of switch 25 do not contribute to any harmonic rejection degradation.

Referring still to FIG. 1, each gain stage 30 has an input IF port ($IF^0$-$IF_{N-1}$) that is coupled to receive the output from mixer 20 when switch 25 enables interconnection to the given IF port. Each gain stage 30 scales the signal at the IF ports (IF0 to IFn-1) by a different factor, or degree. These stages each produce a resultant signal that is provided to a summer block 40 that combines the outputs of all such gain stages 30 to generate an IF output which may be provided to further circuitry of a tuner to process the received signal. Note that in the high level view of FIG. 1, a load stage having IF filters is not shown for ease of illustration. These filters may be also referred to herein as mixer loads that are coupled in negative feedback to the load stage, thus avoiding consumption of any DC current. Note that current-to-voltage conversion occurs at the output of these mixer loads coupled in negative feedback. Since the mixer loads (which can be implemented as RC circuits) are coupled across an operational amplifier, a low output impedance or a voltage source is present at the operational amplifier output. In other words, the current has been converted to a voltage and the operational amplifier drives this voltage through the resistors, which as will be described further below are weighted.

Each gain stage 30 may have a different coefficient $a_0$-$a_{N-1}$ that may be selected to cancel harmonics in the incoming signal. More specifically, in some embodiments the $a_k$ coefficients (where k equals zero to N-1) may be selected based on the following periodic function of the square wave phase:

$$a_k = \sin\left(\frac{2\pi}{N}k\right).$$  [1]

By selecting a given value of N, the harmonics that are cancelled by mixer system 10 may be controlled. As described above, the summation of all of the individual gain blocks 30 (i.e., phases) may be summed at summer block 40 and provided to additional receiver circuitry.

Figure 2:
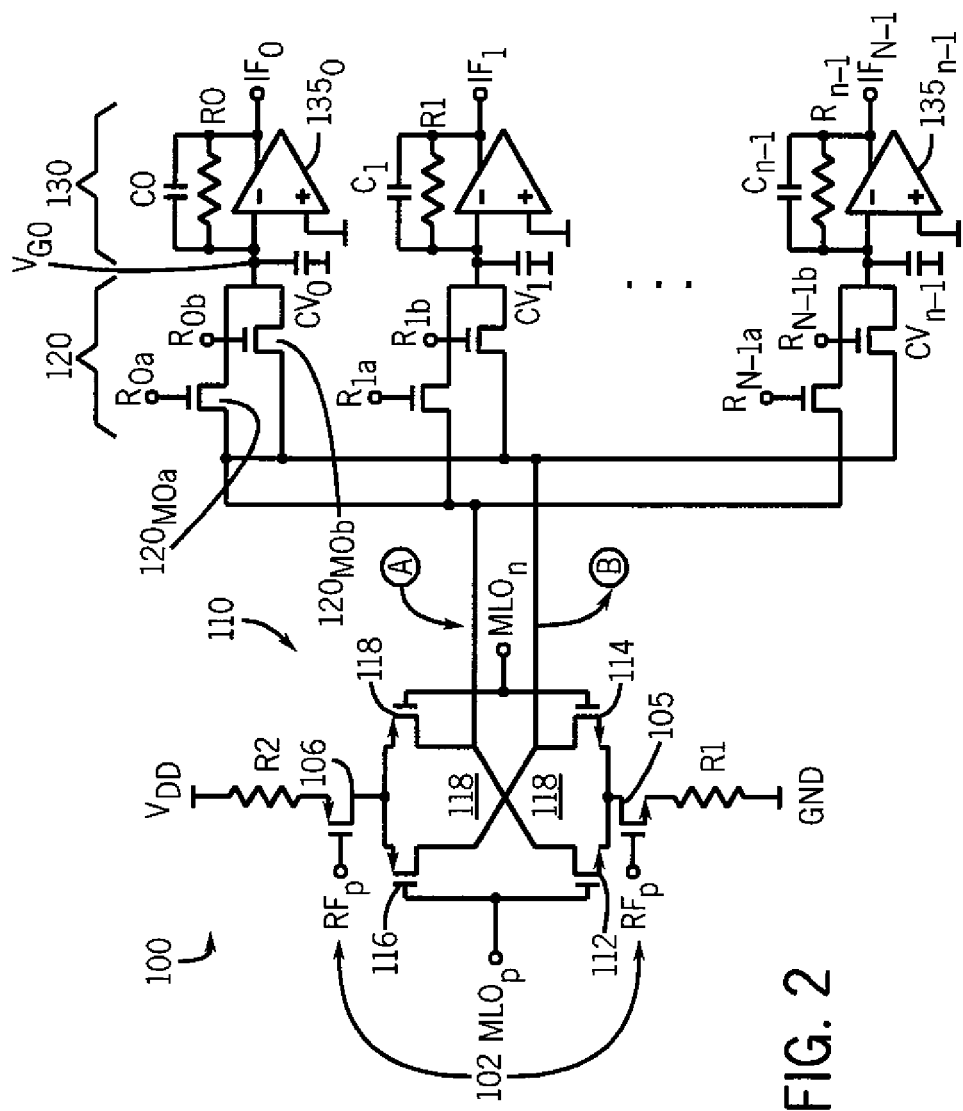
FIG. 2 is a schematic diagram of an implementation of a mixer in accordance with one embodiment of the present invention.

Implementations of a mixer to enable controllable harmonic rejection as well as noise immunity may take different forms. Referring now to FIG. 2, shown is a schematic diagram of an implementation of a mixer in accordance with one embodiment of the present invention. As shown in FIG. 2, mixer 100 is one example implementation of a passive RHRM in which an incoming RF signal ($RF_P$) is provided to a master RF stage 102. Note that FIG. 2 only shows a single balanced mixer for ease of illustration, but understand that a pair of the circuitry shown in FIG. 2 can be implemented to receive and process a differential RF signal.

As shown in FIG. 2, master RF stage 102 may include a n-channel metal oxide semiconductor field effect transistor (nMOSFET) 105 and a p-channel metal oxide semiconductor field effect transistor (pMOSFET) 106 which act as transconductors having gate terminals connected to the RF signal ($RF_P$), and each providing an RF current through a drain terminal. As seen in FIG. 2, nMOSFET 105 may have a source terminal coupled to a reference potential (e.g., a ground reference) through a resistor R1 and via a reference voltage node, and in turn nMOSFET 106 has a source terminal coupled to a supply potential (Vdd) through a resistor R2 and via a supply voltage node.

The outputs of master RF stage 102 are provided to a master LO stage 110 (also referred to as a master switching stage). Master LO stage 110 may act to mix the incoming RF signal with the master clock frequency. Specifically, as shown in FIG. 2 master LO stage 110 may include two differential pairs of transistors, including a first differential pair 113 having nMOSFETs 112 and 114 having source terminals coupled to receive the RF current from master RF device 105, gate terminals coupled to receive the master clock signal (respectively $MLO_P$ and $MLO_N$) and having drain terminals to provide a multiplied output current to a plurality of rotating switches of a rotating switch stage 120. Master LO stage 110 may also include a second differential pair 115 having pMOSFETs 116 and 118 with source terminals coupled to receive the RF current from master RF device 106, gate terminals coupled to receive the master clock signal, and drain terminals to provide a multiplied output current to the rotating switches of rotating switch stage 120. This master LO stage 110 thus provides a mixed current pair at a pair of output nodes A and B.

Rotating switch stage 120 includes a plurality of switch pairs $120M_{0a}$ and $120M_{0b}$-$120M_{n-1a}$ and $120M_{n-1b}$ that can be controlled by gating signals $R_a$<N-1:0> and $R_b$<N-1:0> (note $R_a$ and $R_b$ are distinct signals) respectively, to cyclically switch the output from the master switching devices to each of a plurality of mixer loads 130, which may be formed of a plurality of operational amplifiers $135_0$-$135_{n-1}$. Coupled between the rotating switch outputs and the negative input to these operational amplifiers is a corresponding virtual ground realized by way of a capacitor coupled between the negative input terminal to the operational amplifier and a reference potential (e.g., ground). Specifically as seen, each rotating switch output is coupled to a virtual ground node $VG_0$-$VG_{n-1}$ having a corresponding capacitor CV0-CVn-1 coupled thereto.

Furthermore, to realize reduced power consumption, load stage 130 can include IF filters coupled in negative feedback between an output of corresponding operational amplifiers 135 and the negative input terminals. Specifically as seen, an RC filter formed of a parallel-connected capacitance and resistance can be provided, namely mixer loads or RC filters formed of R0C0 to Rn-1Cn-1. Mixer load stage 130 may thus perform gaining and filtering of the IF signals. In some implementations each of the IF filters may have the same RC weighting. The output of the respective mixer loads 130 may be provided through additional gain stages and impedances, and then on to summing blocks (not shown in FIG. 2), which sum the respective phases and provide the IF output to a desired location.

Note that by way of the virtual ground at the operational amplifier inputs, nodes A and B at the outputs of the master switching devices see this virtual ground and the on resistance of rotational switches 120. Accordingly, the signal swing at these nodes can be reduced. In this way, any potential linearity limitations caused by the swing at the output of master switching stage 110 can be reduced.

Also, looking back from the virtual ground of the operational amplifier input, a high impedance is present. As such, the input-referred noise of the operational amplifiers appears after the mixer gain. Accordingly, noise power can be comparable to a unity gain buffer.

Due to the negative feedback location of the mixer loads, there is no DC voltage drop. Accordingly, linearity can be increased without trading off gain (at least to a first order). Still further with regard to circuit 100, the available voltage (corresponding to the difference between supply voltage and ground potential at the source terminals of transconductors 105 and 106 is used across only the transconductors and master switching devices. Accordingly, a high linearity can be possible as the voltage across the transconductors can be higher for the same power supply voltage. As the input-referred noise is proportional to 1/gm of the transconductors because the nMOS and pMOS transconductors 105 and 106 are in parallel but use the same DC current, reduced thermal noise can be realized.

Figure 3:
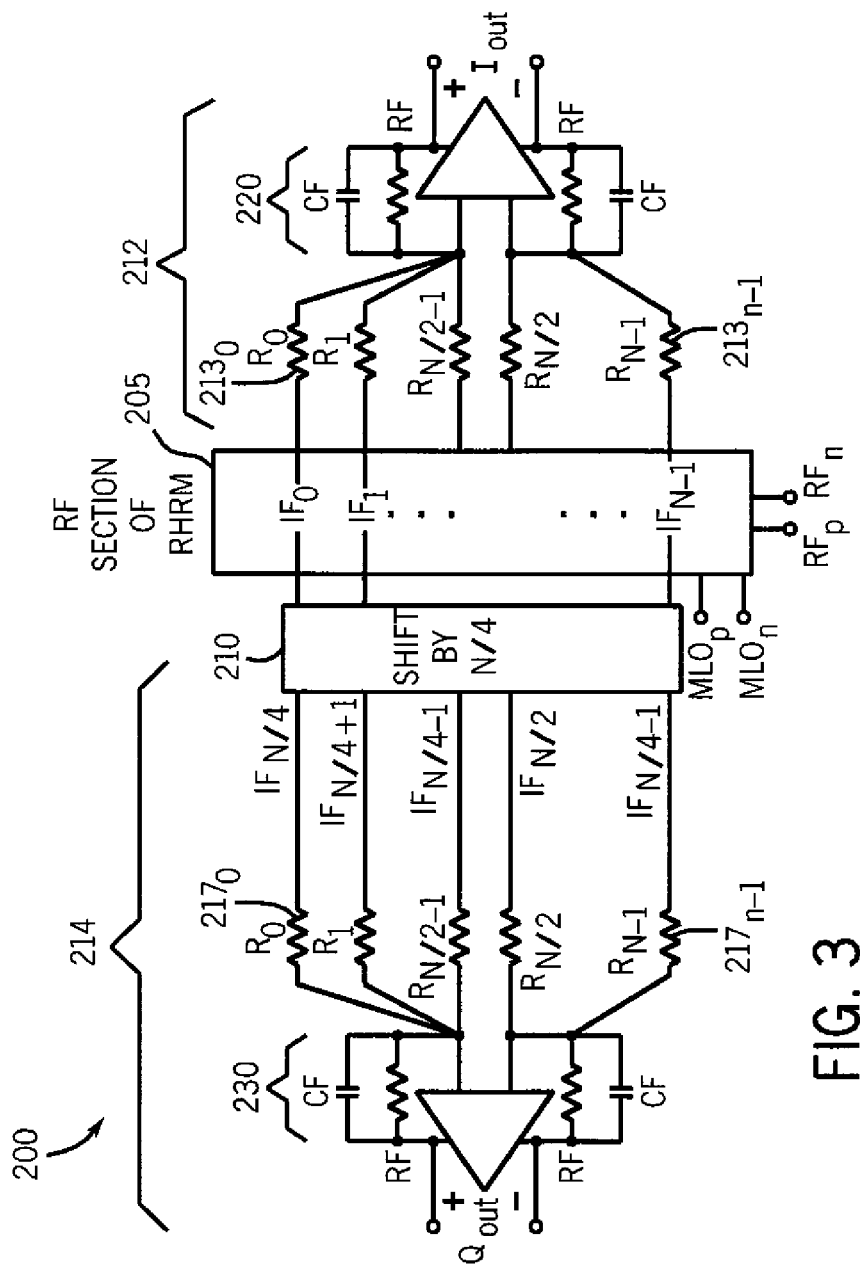
FIG. 3 is a schematic diagram of a quadrature mixer in accordance with an embodiment of the present invention.

Referring now to FIG. 3, shown is a schematic diagram of a quadrature mixer in accordance with an embodiment of the present invention. As shown in FIG. 3, mixer 200 may be coupled to receive an incoming RF signal (i.e., $RF_N$ and $RF_P$) and positive and negative master clocks (i.e., $MLO_N$ and $MLO_P$) and mix these signals in an RF portion 205 (which may correspond to circuit 100 of FIG. 2, and its differential mixer portion) to thus provide IF outputs to an in-phase IF portion 212 and a quadrature-phase IF portion 214. As seen, in-phase IF portion 212 may include a plurality of resistances $213_{N-1}$-$213_0$, outputs of which in turn are provided to a differential amplifier 220, which acts to sum all of the signals and provide a differential voltage output $I_{out}$ at a desired IF frequency. Note that feedback resistors $R_f$ and feedback capacitors $C_f$ are coupled between the respective output and input terminals of differential amplifier 220. Similarly, quadrature IF portion 214 may include a phase shifter 210 that in turn is coupled to resistances $217_{N-1}$-$217_0$, outputs of which are provided to a differential amplifier 230 for summing to output a differential voltage output $Q_{out}$. As seen, phase shifter 210 may provide a phase shift of N/4 to provide phase-shifted IF outputs. Note that resistors 213 and 217 can be weighted accordingly to provide for weighting in accordance with, e.g. a sine wave. In this way, mixer 200 provides I and Q IF outputs.

In various embodiments, each resistance 213 may be of a different value. More specifically, in one embodiment:

$$R_I <k> = \frac{Runit}{\sin\left(\frac{2\pi}{N}k\right)} \quad [2]$$

for $k = 0$ to $N - 1$ where Runit is a unitary or normalized resistance value. In some implementations, the unitary resistance value may be based on a resistor ratio such that the different resistors approximate a sine wave as closely as possible to improve harmonic rejection. In some embodiments, the integer ratios may be implemented with resistors connected in parallel for each of $R_I<k>$, with each resistor of a uniform length/width. These resistor ratios may be integer approximations of a sine wave in some embodiments. For example, in one implementation for 16 sine wave coefficients, a plurality of integer values may be chosen to provide for third order harmonic rejection of approximately 56 dB, with fifth order harmonic rejection of approximately 53 dB and seventh order harmonic rejection of approximately 48 db. As shown in Table 1 below, various integer fits for a sine wave may be used in different embodiments, which provide for various levels of harmonic rejection, in one implementation.

TABLE 1

| Sine wave coefficient (N = 16) | | | | | | | | dB S/3 | dB S/5 | dB S/7 | dB S/9 |
|---|---|---|---|---|---|---|---|---|---|---|---|
| 9 | 17 | 22 | 24 | 22 | 17 | 9 | 0 | 56 | 53 | 48 | 51 |
| 2 | 12 | 20 | 25 | 26 | 23 | 17 | 8 | 47 | 56 | 42 | 54 |
| 8 | 17 | 23 | 26 | 25 | 20 | 12 | 2 | 47 | 56 | 52 | 54 |
| 3 | 13 | 21 | 26 | 27 | 24 | 17 | 8 | 52 | 50 | 48 | 51 |
| 8 | 17 | 24 | 27 | 26 | 21 | 13 | 3 | 52 | 50 | 48 | 51 |
| 4 | 14 | 22 | 27 | 28 | 24 | 17 | 7 | 45 | 46 | 51 | 53 |
| 4 | 15 | 24 | 29 | 30 | 26 | 18 | 8 | 51 | 49 | 48 | 51 |
| 8 | 18 | 26 | 30 | 29 | 24 | 15 | 4 | 51 | 49 | 49 | 51 |

Furthermore, if quarter sine wave coefficients are used, integer ratios of 0, $9^{1/5}$, 17, $22^{1/5}$, and 24 may be realized for a quarter sine wave, providing harmonic rejection in excess of 65 dB. By using integers to approximate a sine wave, immunity from end effects and modeling errors may be realized. Note further that the different weighting values used may be applied in different order to the phases than that shown above.

In turn, resistances 217 may have values that mimic a "cosine" wave rather than a "sine" wave. In such an implementation, the quadrature phase resistances may be in accordance with the following equation:

$$R_Q <k> = \frac{Runit}{\cos\left(\frac{2\pi}{N}k\right)} \quad [3]$$

for $k = 0$ to $N - 1$

In various embodiments, improved image rejection may be realized by way of such a quadrature mixer. This is so, as matching between I and Q outputs is solely determined by matching in the IF section, for the same reasons discussed above. That is, because mismatches in the master LO devices and master RF devices do not cause any gain/phase errors between the different IF <k> outputs, the quadrature signals derived from these IF outputs have improved image rejection.

Rotating switches such as switches 120 shown in FIG. 2 can be implemented in a variety of manners. As seen, rotating switch stage 120 may include a plurality of nMOSFET pairs 120M$_{0a,b}$-120$_{n-1a,b}$ each having a source terminal coupled to receive one of the current pairs from a corresponding one of the output nodes of master switching stage 110. Further, each MOSFET may have a gate terminal controlled by a different one of a plurality of gating signals R0$_{a,b}$ <0:N-1>. As described above, each MOSFET may be cyclically controlled to enable each MOSFET to output via its drain terminal the current input signal for a given portion of the LO cycle. Thus the outputs of rotating switch 120 may be provided at a plurality of output nodes at the virtual ground input to the operational amplifiers of mixer load 130 of FIG. 2.

Figure 4A:
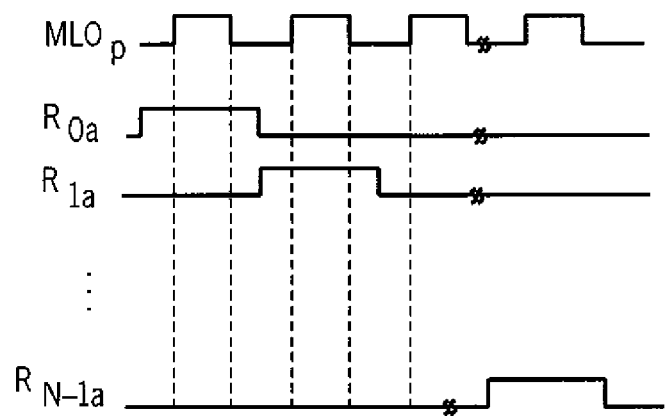
FIG. 4A is a first timing diagram of control signals for a rotating switch in accordance with one embodiment of the present invention.
Figure 4B:
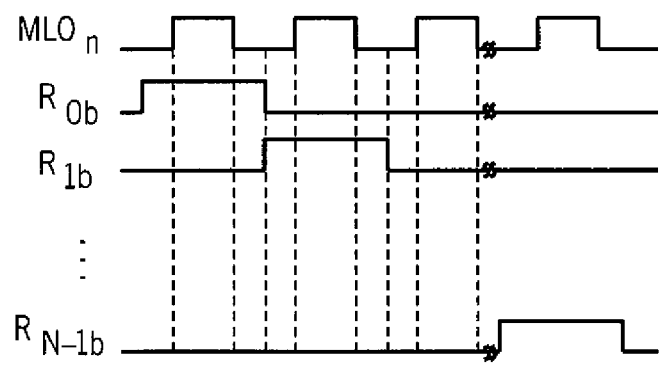
FIG. 4B is a second timing diagram of control signals for a rotating switch in accordance with one embodiment of the present invention.

To enable rotating switch 120 to rotate the input current between its various outputs, the gates of the MOSFETs may be driven in accordance with the timing diagrams shown in FIGS. 4A and 4B, respectively in one embodiment. FIG. 4A shows the master clock frequency for the positive input current (i.e., MLO$_P$) which is a square wave signal. As shown in FIG. 4, for a given period of the LO, N cycles of the master clock may be generated. In turn, one MOSFET of each MOSFET pair of the rotating switches may be controlled cyclically by a given control signal Rk$_{n-1a}$, where k varies from 1 to N. Note that these control signals are also square wave signals that may have a pulse width equal to about a time period of the master clock. Furthermore, note that the control signals are individually enabled to a high state during a low portion of the master clock. While shown as switching at approximately halfway through a low state of the master clock frequency, the scope of the present invention is not limited in this regard. By enabling each MOSFET in turn, during a single period of the LO one MOSFET of each MOSFET pair may be enabled for a time period of LO divided by N.

As shown in FIG. 4B, a similar timing mechanism may be enabled for the negative master clock signals, i.e., MLO$_N$. Note that the positive and negative master clock signals are complementary versions of each other. The transitions in the control signals Rk$_{n-1b}$, where K equals 1 to N, occur when the master clock is at a low state. Thus there is no current in the rotating switches when the gates of the MOSFETs are being toggled, and any random offsets between the MOSFETs in the rotating switches do not affect their output. Note that the same is true for any noise in the switches. Any mismatches in the master LO devices affect all outputs of the rotating switches equally. Still further, any mismatches in the master RF devices affect all outputs of the rotating switches equally, because it is the same RF current that is cyclically rotated between the different mixer outputs. Accordingly, mismatches in both the RF and LO devices do not cause any harmonic rejection degradation. Instead, the only components that could cause such harmonic rejection degradation are devices in the IF portions (i.e., mixer loads 130 of FIG. 2). For a downconversion mixer such as used in various receiver architectures, because the IF is at a much lower frequency than the received RF signal, the negative feedback stage may be provided and any gain/phase errors caused by these stages are largely dependent on passive components such as resistors and capacitors, and not active components such as transistors. Because for a typical IC process such as a CMOS process, passive components match much better than their active counterparts, enabling mismatch errors between passive components can greatly reduce harmonic rejection degradation.

A mixer in accordance with an embodiment of the present invention thus shifts the device matching problem of harmonic rejection from high frequency RF/LO devices to lower frequency IF devices, and further shifts device matching issues from poorly matching active devices to better matching passive devices. Such a mixer can achieve improved harmonic rejection while reducing both power consumption and die area consumed by the mixer.

Figure 5:
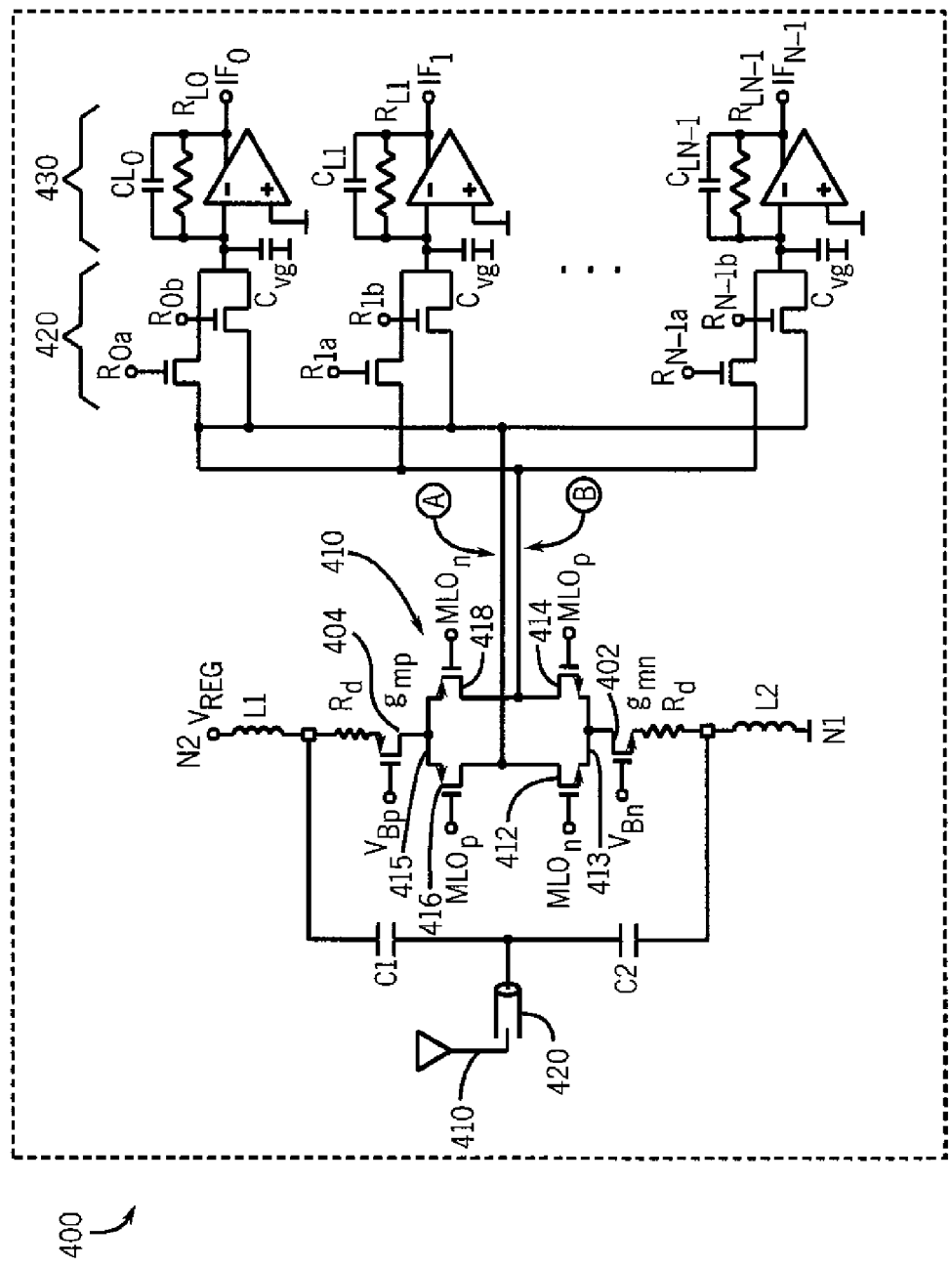
FIG. 5 is a schematic diagram of a direct input of an RF signal into a mixer in accordance with one embodiment of the present invention.

Because a passive implementation of a harmonic rejection mixer can be realized with very low noise, high linearity and low power, it is possible to couple the mixer directly to an RF input signal received by an antenna, thus avoiding the need for conventional RF input circuitry, including an amplifier such as a low noise amplifier, a pre-filter and a balun. Referring now to FIG. 5, shown is a schematic diagram of a portion of a mixer in accordance with an embodiment the present invention directly coupled to an antenna input. As shown in FIG. 5, circuit 400 is coupled to receive an RF input directly from an F connector 420 that in turn is coupled to an antenna 410. This single-ended RF input signal is coupled through a pair of capacitors C1 and C2 that act as a DC block to thus provide the input RF signal to input terminals of a pair of master RF devices 402 ($gm_n$) and 404 ($gm_p$). As seen in the embodiment of FIG. 5, master RF device 402 can be a nMOSFET having a source terminal coupled to receive the RF input signal, a gate terminal biased by a bias voltage Vbn and having a drain terminal to provide an RF current. Similarly, master RF device 404 may be a pMOSFET having a source terminal coupled to receive the RF input signal, a gate terminal biased by a bias voltage Vbp and having a drain terminal to provide an RF current.

As seen, the source terminals of the master RF devices can further be coupled to, respectively a supply voltage and a ground voltage. Specifically, master RF device 402 may have a source terminal that is coupled through an impedance circuit including a resistor Rd and an inductor L2 to a reference potential at a first node N1. In turn, master RF device 404 has a source terminal coupled through an impedance circuit including a resistor Rd and an inductor L1 to a supply voltage at a second node N2.

As further seen in FIG. 5, a master switching stage 410 can be implemented with multiple differential pairs. Specifically, master RF device 402 couples to a first differential pair 413. Namely, the drain terminal of MOSFET 402 can be coupled to the source terminals of a pair of nMOSFETs 412 and 414 of first differential pair 413. As seen each of these transistors of the differential pair can be gated by an opposite polarity of the master clock, namely $MLO_N$ and $MLO_P$. In turn, the drain terminals of MOSFETs 412 and 414 can be coupled to respective output nodes of master switching stage 410, namely node A and node B. Similarly, a drain terminal of master RF device 404 may be coupled to source terminals of a second differential pair 415, which can be formed of a pair of pMOSFETs 416 and 418. As seen, each of these transistors of the differential pair can be gated by an opposite polarity of the master clock. In turn, the drain terminals of MOSFETs 416 and 418 can be coupled to respective output nodes A and B of master switching stage 410.

The remaining RF section of mixer 400, namely rotating switch stage 420 and load stage 430 can be configured similarly to stages 120 and 130 described above in FIG. 2. And similarly, as described above with regard to, e.g., FIG. 3, the outputs of the RF section can be provided to gain stages and summers to thus generate quadrature IF signals that can be provided to further receiver circuitry.

As seen in FIG. 5, the transconductance stage formed of MOSFETs 402 and 404 has a common gate configuration, which provides a low input impedance and high linearity, aiding in a low noise factor. Furthermore, load resistors of the mixer can be of higher values, resulting in a low noise factor of the input stage. In addition, the gain provided to an IF section of the mixer can also be higher, allowing noise of subsequent stages to be small as referred to the input.

For example, assuming matching between the transconductors of the input stage (($1/gm_p$+Rd) is substantially equal to ($1/gm_n$+Rd)), and which equals 25Ω, the load resistance of the load stages can be approximately 4Ω, with corresponding load capacitors of approximately 4 pF. Assuming N corresponding to the number of stages equals 8, a noise factor of the input stage may be under approximately 3 dB.

Furthermore, by not using a balun, no loss or noise factor degradation can be attributed to it, further aiding in a low noise factor. Still further, second order distortion, which is caused by an asymmetric response to positive and negative half cycles of an input signal, can be reduced as the input stage configuration provides for high IIP2, by balancing nMOSFETs and pMOSFETs in the transconductor stage and master switching stage.

Furthermore, $1/gm_p$ is a small fraction of the total degeneration resistance (including antenna impedance), e.g., approximately 1/10 such that any mismatches in $1/gm_p$ as compared to $1/gm_n$, are reduced. As sufficient IIP2 performance is possible with a mixer in accordance with an embodiment of the present invention, a balun can be avoided.

Embodiments further provide for high IIP3, which is approximately proportional to Von $(1+gmRd)^{3/2}$. Here, the Rd corresponds to the on-chip degeneration resistance and the antenna impedance, and thus may be approximately equal to 75Ω and thus gmRd is approximately 8-10, resulting in IIP3 in excess of 20 dB. Note that the impedance at the rotating switch stage input may be relatively small (e.g., less than approximately 30Ω) at all frequencies where blockers are possible.

Embodiments further provide for RF matching and insensitivity due to the switching scheme of the rotating switches. Still further, as the first voltage signal on-chip is a downconverted IF signal by way of the direct connection of the antenna to the mixer, better blocker ratios can be realized. That is, as negative feedback can be implemented at lower frequencies, larger swings can be tolerated without distorting the signal at low frequencies, and in addition the downconverted blockers can be filtered heavily by the IF filters. Still further, embodiments can provide for much lower power consumption than with a conventional implementation including an LNA. Furthermore, the mixer's power dissipation can be avoided by way of the passive rotating switches and the lack of DC current flowing through the load.

In addition to improved harmonic and image rejection provided by embodiments of the present invention, better second-order intermodulation products ($IP_2$) also can be achieved.

Figure 6:
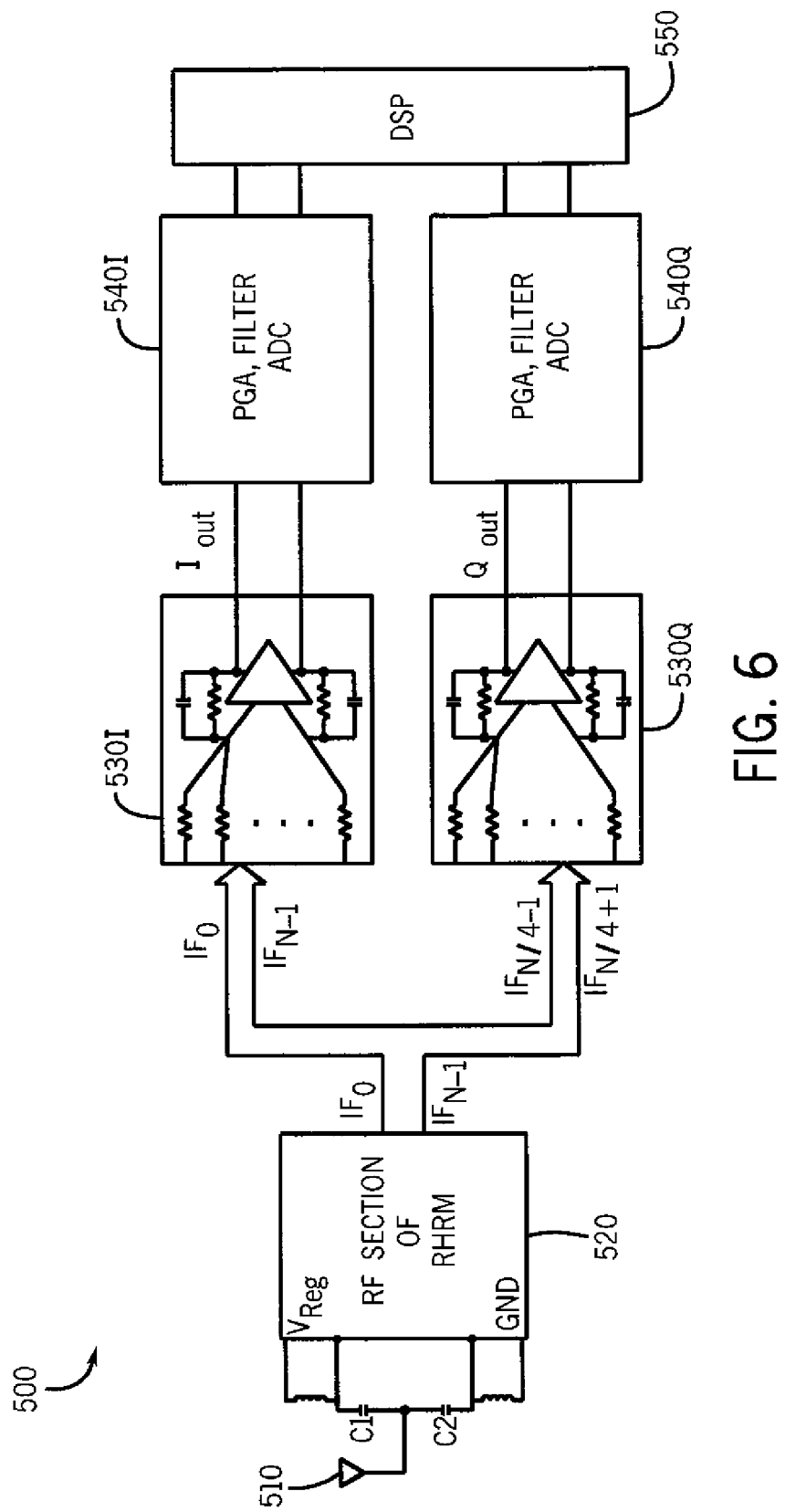
FIG. 6 is a block diagram of a receiver front end architecture in accordance with an embodiment of the present invention.

Referring now to FIG. 6, shown is a block diagram of a receiver front end architecture in accordance with an embodiment of the present invention. As shown in FIG. 6, receiver 500 may include a passive rotating harmonic rejection mixer as configured, e.g., in FIG. 5. Accordingly, incoming RF signals received at an antenna 510 may be coupled through capacitors C1 and C2 directly to the mixer. More specifically as seen, the incoming RF signals may be directly provided to an RF section 520. In one embodiment, this RF section can be configured as shown in FIG. 5. The resulting IF signals may then be provided to corresponding IF sections 530I and 530Q. As seen, each of these IF sections can include weighted resistors and summers to thus generate quadrature IF signals $I_{out}$ and $Q_{out}$. These signals may be provided to further circuitry for additional processing. In the embodiment shown in FIG. 6, such circuitry may include amplifiers such as a programmable gain amplifier (PGA), filters, and an analog-to-digital converter (ADC) (generically, 540I and 540Q) to thus convert the lower frequency signals to digital baseband signals where they can be processed in a digital signal processor (DSP) 550. As part of the processing, DSP 550 may be configured to perform demodulation on the incoming signals to thus provide demodulated signals, which can correspond to audio output signals, demodulated data or so forth. Although shown at this high level in the embodiment of FIG. 6, understand the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a master radio frequency (RF) device to receive an incoming RF signal and provide an RF current, the master RF device having a first transconductor to receive the incoming RF signal and coupled to a reference potential node and a second transconductor to receive the incoming RF signal and coupled to a supply voltage node;
   a master local oscillator (LO) device coupled to an output of the master RF device, the master LO device to receive the RF current and mix the RF current with a master clock signal to obtain a mixed signal pair, the master LO device including a first differential pair coupled to the first transconductor and a second differential pair coupled to the second transconductor;
   a rotating switch stage coupled to the master LO device to cyclically switch the mixed signal pair to one of a plurality of output ports of the rotating switch stage, the rotating switch stage including a plurality of switching pairs each to receive one of the mixed signal pair;
   a plurality of mixer loads each coupled to one of the plurality of output ports, each of the plurality of mixer loads to perform gaining and filtering of the mixed signal pair, each of the plurality of mixer loads including an operational amplifier having a first input terminal coupled to a corresponding output port and a second input terminal to couple to a reference potential; and
   a plurality of resistors each coupled to one of the plurality of mixer loads to weight the output of the corresponding mixer load and to provide an output to a summer.

2. The apparatus of claim 1, wherein the first and second transconductors are to be gated by the incoming RF signal and to pass the RF current to the master LO device.

3. The apparatus of claim 1, wherein the first differential pair is of a first polarity of metal oxide semiconductor field effect transistor (MOSFET) and the second differential pair is of a second polarity of MOSFET, wherein an output terminal of one of the first differential pair and an output terminal of one of the second differential pair are coupled to provide a first one of the mixed signal pair, and an output terminal of a second one of the first differential pair and an output terminal of a second one of the second differential pair are coupled to provide a second one of the mixed signal pair.

4. The apparatus of claim 3, wherein each of the switching pairs comprises a first transistor to receive the first one of the mixed signal pair and to output the first one of the mixed signal pair when the first transistor is enabled by a first control signal and a second transistor to receive the second one of the mixed signal pair and to output the second one of the mixed signal pair when the second transistor is enabled by a second control signal, wherein a value of the first and second control signals is changed when a value of the master clock signal of a first polarity is at a low state.

5. The apparatus of claim 1, further comprising a capacitance coupled to the first input terminal of each of the operational amplifiers of the plurality of mixer loads at a virtual ground node.

6. The apparatus of claim 5, further comprising a filter coupled in a feedback loop between an output and the first input terminal of each of the operational amplifiers of the plurality of mixer loads.

7. The apparatus of claim 6, wherein the filter comprises a capacitor coupled in parallel with a resistor, wherein no DC current flows through the filter.

8. An apparatus comprising:
   a master radio frequency (RF) device to receive an incoming single-ended RF signal and provide first and second RF currents;
   a master local oscillator (LO) device coupled to an output of the master RF device, the master LO device to receive the first and second RF currents and mix each of the first and second RF currents with a master clock signal of a first polarity and a second polarity to obtain a mixed signal pair;
   a rotating switch coupled to the master LO device to cyclically switch the mixed signal pair to one of a plurality of virtual ground nodes at an output of the rotating switch;
   a plurality of operational amplifiers each having a first input terminal coupled to one of the plurality of virtual ground nodes, each of the plurality of operational amplifiers having a feedback filter coupled thereto; and
   a plurality of gain stages each coupled to one of the plurality of operational amplifiers to weight the output of the corresponding operational amplifiers.

9. The apparatus of claim 8, further comprising a summer coupled to the plurality of gain stages to sum an output of each of the gain stages.

10. The apparatus of claim 8, wherein the master RF device comprises first and second transconductors to be gated by the incoming RF signal and to pass the first and second RF currents to the master LO device.

11. The apparatus of claim 8, wherein the rotating switch is a passive switch.

12. The apparatus of claim 8, wherein the apparatus comprises a passive rotating harmonic rejection mixer (RHRM).

13. The apparatus of claim 12, wherein the passive RHRM is coupled to receive the incoming single-ended RF signal directly from an antenna.

14. The apparatus of claim 8, wherein the feedback filter coupled to each of the operational amplifiers comprises a resistor and a capacitor coupled in parallel between an output of the corresponding operational amplifier and the first input terminal of the corresponding operational amplifier.

15. A system comprising:
   an antenna to receive a radio frequency (RF) signal;
   a passive rotating harmonic rejection mixer (RHRM) coupled directly to the antenna to receive and downconvert the RF signal to a second frequency signal, the passive RHRM comprising:

a transconductor stage to receive the RF signal and convert the RF signal to an RF current pair;

a mixing stage to downconvert the RF current pair to a second frequency current pair;

a passive switch stage to receive the second frequency current pair and to cyclically rotate the second frequency current pair to a plurality of virtual ground nodes; and a load stage having a plurality of operational amplifiers each coupled to a corresponding one of the virtual ground nodes;

second frequency circuitry to receive and process the second frequency signal; and a demodulator coupled to the second frequency circuitry to demodulate the processed second frequency signal to obtain a demodulated signal.

16. The system of claim 15, further comprising a pair of capacitances coupled to the antenna to AC couple the RF signal to the passive RHRM.

17. The system of claim 15, further comprising a first inductor coupled between a reference voltage node and a first input terminal of the transconductor stage and a second inductor coupled between a supply voltage node and a second input terminal of the transconductor stage.

18. The system of claim 15, wherein the mixing stage comprises a master local oscillator (LO) device to receive the RF current pair and mix the RF current pair with a master clock signal to obtain the second frequency current pair, the master LO device including first and second differential pairs coupled to the transconductor stage.

19. The system of claim 18, wherein the passive switch stage comprises a first transistor to receive a first one of the second frequency current pair and to output the first one of the second frequency current pair when the first transistor is enabled by a first gating signal and a second transistor to receive a second one of the second frequency current pair and to output the second one of the second frequency current pair when the second transistor is enabled by a second gating signal, wherein a value of the first and second gating signals is changed when a value of the master clock signal is at a low state.

20. The system of claim 19, wherein the load stage further comprises a filter coupled in a feedback loop between an output and an input of each of the operational amplifiers, the filter comprising a capacitor coupled in parallel with a resistor, wherein no DC current flows through the filter.

21. The system of claim 15, wherein the passive RHRM is coupled directly to the antenna without a low noise amplifier, a balun or a tracking filter.

* * * * *